United States Patent
Geluk

(10) Patent No.: US 10,921,216 B2
(45) Date of Patent: Feb. 16, 2021

(54) METHOD AND SYSTEM FOR EFFICIENT LOAD IDENTIFICATION

(71) Applicant: SIEMENS INDUSTRY SOFTWARE NV, Leuven (BE)

(72) Inventor: Theo Geluk, L Tholen (NL)

(73) Assignee: SIEMENS INDUSTRY SOFTWARE NV, Leuven (BE)

(*) Notice: Subject to any disclaimer, the term of this patent is extended or adjusted under 35 U.S.C. 154(b) by 33 days.

(21) Appl. No.: 16/335,741

(22) PCT Filed: Sep. 23, 2016

(86) PCT No.: PCT/EP2016/072674
§ 371 (c)(1),
(2) Date: Mar. 22, 2019

(87) PCT Pub. No.: WO2018/054480
PCT Pub. Date: Mar. 29, 2018

(65) Prior Publication Data
US 2019/0301978 A1    Oct. 3, 2019

(51) Int. Cl.
*G01M 17/04* (2006.01)
*G06F 17/16* (2006.01)
(Continued)

(52) U.S. Cl.
CPC ............. *G01M 17/04* (2013.01); *G06F 17/16* (2013.01); *G01L 5/16* (2013.01); *G01M 17/007* (2013.01);
(Continued)

(58) Field of Classification Search
CPC .. G01M 17/0078; G01M 17/04; G01M 17/06; G01M 17/02; G01M 17/0072;
(Continued)

(56) References Cited

U.S. PATENT DOCUMENTS 9,080,921 B2 *   7/2015   Okada .................... G01L 25/00
10,005,472 B2 *  6/2018   Anthonis .............. B60W 40/12
(Continued)

FOREIGN PATENT DOCUMENTS

CN     103149037    6/2013
CN     103364140    10/2013
(Continued)

OTHER PUBLICATIONS

PCT International Search Report and Written Opinion of International Searching Authority dated May 19, 2017 corresponding to PCT International Application No. PCT/EP2016/072674 filed Sep. 23, 2016.

*Primary Examiner* — Jonathan M Dunlap
(74) *Attorney, Agent, or Firm* — Cozen O'Connor

(57) ABSTRACT

A method, system, apparatus and computer program for identifying loads impacting a vehicle that includes a vehicle body and a suspension system, wherein the method includes acquisition of a system response from a plurality of sensors under dedicated conditions in a test environment, where the said sensors are assigned to the suspension of the vehicle, acquisition of system loads by applying the same dedicated conditions in a simulation environment, generation of a calibration matrix based on data pertaining to the system response and data pertaining to the system loads, acquisition of an operational system response from the plurality of sensors in a test-track situation, and utilization of the acquired operational system response and the calibration matrix for calculating numerical values for the loads impacting the vehicle.

10 Claims, 3 Drawing Sheets

(51) Int. Cl.
| | |
|---|---|
| *G01M 17/007* | (2006.01) |
| *G01M 17/06* | (2006.01) |
| *G01L 5/16* | (2020.01) |
| *G01M 17/02* | (2006.01) |
| *G06F 30/23* | (2020.01) |
| *G06F 30/20* | (2020.01) |

(52) U.S. Cl.
CPC .... *G01M 17/0072* (2013.01); *G01M 17/0078* (2013.01); *G01M 17/02* (2013.01); *G01M 17/06* (2013.01); *G06F 30/20* (2020.01); *G06F 30/23* (2020.01)

(58) Field of Classification Search
CPC ....... G01M 17/007; G01L 5/16; B60W 40/10; B60W 40/107; B60W 40/109; B60W 40/11; B60W 40/112; B60W 40/114; B60W 40/103; B60W 40/101; B60W 40/1005; B60W 40/105; G06F 30/23; G06F 30/20
See application file for complete search history.

(56) References Cited

U.S. PATENT DOCUMENTS

| | | |
|---|---|---|
| 2012/0079868 A1 | 4/2012 | Okada et al. |
| 2016/0129915 A1 | 5/2016 | Anthonis et al. |

FOREIGN PATENT DOCUMENTS

| | | |
|---|---|---|
| CN | 104424368 | 3/2015 |
| CN | 105588675 | 5/2016 |
| CN | 105675309 | 6/2016 |
| CN | 105718607 | 6/2016 |

\* cited by examiner

METHOD AND SYSTEM FOR EFFICIENT LOAD IDENTIFICATION

CROSS-REFERENCE TO RELATED APPLICATIONS

This is a U.S. national stage of application No. PCT/EP2016/072674 filed Sep. 23, 2016, the content of which is incorporated herein by reference in its entirety.

BACKGROUND OF THE INVENTION

1. Field of the Invention

The present invention generally relates to a method, system and a device for an advanced load identification technique that enables amongst others vehicle dynamic performance evaluation.

2. Description of the Related Art

In-depth vehicle dynamic performance evaluations have as yet been implemented through identification of the time-domain loads acting on a vehicle body structure. Vehicle body structure deformation can be calculated by using these time-domain loads for identifying potential weak spots in the vehicle body design. Furthermore, the transient build-up of each load can be evaluated for different vehicle configurations and/or different vehicle body configurations to understand how changes in suspension or body characteristics affect the total vehicle performance. Time-domain body loads can be used for identifying objective parameters describing vehicle performance and such parameters can be linked to subjective driver ratings. Moreover, benchmarking between different vehicles for comparing vehicle performance, specifically vehicle suspension performance, can be based on time-domain loads for, e.g., identifying the optimization potential of a currently used suspension layout.

As yet, accurate time-domain load identification for vehicle dynamic performance evaluations requires high-channel-count systems, i.e., high-channel-count vehicle body instrumentation with usually more than a hundred channels and special strain-gauges for obtaining time-domain strain-data. For obtaining the relation between body load and strain, transfer-function (FRF; frequency response functions) measurements are performed to identify the strain to force calibration values for all body loads and instrumented strain gauges. A calibration matrix comprising the identified calibration values will be used together with operational strain-data to identify the body loads. The calibration matrix, referred to as strain-to-force calibration matrix or simply as calibration matrix in the following, needs to be inverted for further use. A multiplication of a vector comprising the strain-data and the inverted calibration matrix finally yields the loads impacting on the vehicle body structure.

This prior art approach suffers from certain drawbacks. On the one hand, it involves a large number (usually 150 to 250) of strain-gauges applied to the body structure for strain-data acquisition, where each strain-gauge must be installed on the body structure and wired to a measuring system. On the other hand, it involves a large and complex transfer-function measurement effort to identify the calibration matrix. Furthermore, even with high-channel-count instrumentation and optimized transfer-function measurement approaches, this method has significant mathematical limitations in the case of mechanical structures with a lot of close-by acting body loads, which cannot be identified accurately due to matrix conditioning problems.

Additionally, the calibration matrix needs to be re-measured for each different vehicle body type, giving an extra potential uncertainty on the identified loads as each resulting calibration matrix can have its own limitations related to factors such as conditioning or signal-to-noise ratio.

SUMMARY OF THE INVENTION

In view of the foregoing, it is therefore an object of the invention to provide an improved method, system and device for an efficient load identification technique that can be used for vehicle dynamic performance evaluations and addresses or ameliorates the foregoing and other problems.

This and other objects and advantages are achieved in accordance with the invention by a method for an efficient load identification technique that can be used for vehicle dynamic performance evaluations. The relevant vehicle comprises a vehicle body and a suspension system. A plurality of sensors for acquiring strain-data is assigned to the vehicle's suspension system, e.g., by assigning each sensor to a suspension system component.

The method comprises acquiring a system response from a plurality of sensors under dedicated conditions in a test environment, where the sensors are assigned to the vehicle's suspension system; acquiring system loads by means of applying the same dedicated conditions in a simulation environment, generating a calibration matrix based on data pertaining to the system response and based on data pertaining to the system loads, acquiring an operational system response from the sensors in a test-track situation, and using the acquired operational system response and the calibration matrix to calculate numerical values for the loads impacting the vehicle.

In a preferred specific embodiment, the method comprises acquiring strain-data from a plurality of sensors by applying kinematics & compliances scenarios (K&C scenarios) in a test environment, acquiring suspension system to vehicle body loads data by applying the same K&C scenarios in a simulation environment, generating a calibration matrix based on the acquired strain-data and based on the acquired suspension system to vehicle body forces-data, acquiring operational strain-data from the sensors in a test-track situation, and using the operational strain-data and the calibration matrix to calculate numerical values for the loads impacting the vehicle.

The resulting numerical values for the loads, i.e., forces, identified can be used for, e.g., recommendations for suspension design and/or body design improvement and also for vehicle benchmarking.

Multiple K&C scenarios are known in the art per se and applying K&C scenarios to a vehicle is usually performed using laboratory test systems, e.g., dedicated kinematics & compliance test machines and vehicle dynamic simulators. K&C testing is used to accurately establish the kinematic characteristics of a vehicle's suspension and steering system geometries and the compliance characteristics of the suspension springs, anti-roll bars, elastomeric bushes and component deformations. Knowledge of these characteristics is an essential aid for suspension engineers wishing to establish a thorough understanding of the vehicle's performance in terms of ride, impact isolation, steering and handling.

The resulting calibration matrix is defined in force over strain, implying that it does not need to be inverted anymore for the force estimation process, which strongly enhances the force estimation stability. The calibration matrix is calculated using load-data and strain-data obtained in a K&C simulation environment and a K&C test environment, respectively. Thus the prior art measurement of frequency response functions is replaced by the use of dedicated K&C scenarios both in a test environment and a simulation environment. After the calibration matrix is calculated, this matrix can be applied to operational strain data (E(t)) from track measurements to calculate the time-domain track forces (F(t)) acting on the car body structure or on suspension components.

It is also an object of the invention to provide a system for an efficient load identification technique that can be used for vehicle dynamic performance evaluations, comprising means for performing the method. In an embodiment of the system for identifying loads impacting a vehicle, which comprises a vehicle body and a suspension system, the system comprises a processing unit and a plurality of sensors for obtaining strain-data, where the sensors are assigned to the vehicle's suspension system. The system is configured to acquire strain-data from the sensors by applying K&C scenarios in a test environment and to acquire suspension system to vehicle body loads data by applying the same K&C scenarios in a simulation environment. The system is furthermore configured to generate a calibration matrix based on the strain-data and based on the suspension system to vehicle body loads data. The system is still further configured to acquire operational strain-data from the sensors in a test-track situation and to use the operational strain-data and the calibration matrix to calculate numerical values for the loads impacting the vehicle.

It is also an object of the invention to provide a device for an efficient load identification technique, which is configured for use in the system and/or configured to perform the method. An embodiment of a device in accordance with this aspect of the disclosure is termed "processing unit" in the following.

A processing unit for identifying loads impacting a vehicle in accordance with the disclosed embodiments is configured to the acquire strain-data from the sensors by applying K&C scenarios in a test environment, acquire suspension system to vehicle body loads data by applying the same K&C scenarios in a simulation environment, generate a calibration matrix based on the strain-data and the suspension system to vehicle body loads data, acquire operational strain-data from the sensors in a test-track situation, and use the operational strain-data and the calibration matrix to calculate numerical values for the loads impacting the vehicle, or, more generally, is configured to execute the steps of the method in accordance with the disclosed embodiments.

The sensors used by the processing unit and which are connected to the processing unit for transmitting strain-data to the processing unit are assigned to the vehicle's suspension system, e.g., in that each sensor is assigned to one component of the vehicle's suspension system.

It is also an object of the invention to provide a computerized system for an efficient load identification technique, comprising means for executing a computer program providing an implementation of the disclosed embodiments of the method in accordance with the invention, for example, a computerized system comprising a processing unit, where the processing unit comprises a memory which stores a computer program and stores data generated by and processed with the computer program, and a processor configured to execute a computer program stored in the memory. The processing unit and its memory and processor as well as the computer program providing an implementation of the disclosed embodiments of the method all constitute means for an efficient load identification technique and the computer program is executed by the processor when the processing unit is employed for a load identification for, e.g., vehicle dynamic performance evaluations. The aforementioned processing unit, when comprising a processor, memory and a computer program implementing the method in accordance with the disclosed embodiments, can be perceived as an exemplary embodiment of a computerized system for an efficient load identification technique.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The above-mentioned and other concepts of the present invention will now be addressed with reference to the drawings of the preferred embodiment of the present invention. The shown embodiment is intended to illustrate, but not to limit the invention. The drawings contain the following figures, in which like numbers refer to like parts throughout the description and drawings, in which.

DETAILED DESCRIPTION OF THE EXEMPLARY EMBODIMENTS

This disclosure describes a method, a system and a device providing an efficient load identification technique that amongst others can be used for vehicle dynamic performance evaluations. Those skilled in the art will readily understand that the approach proposed here can be applied to various types of vehicles, e.g., passenger cars, sports cars, trucks, and also to parts of such vehicles, e.g., a soft mounted subframe, different suspension components and either the front or the rear axle. Furthermore, those skilled in the art will readily understand that the approach can be used by OEM vehicle producers, test or inspection facilities and/or the racing industry.

Figure 1:
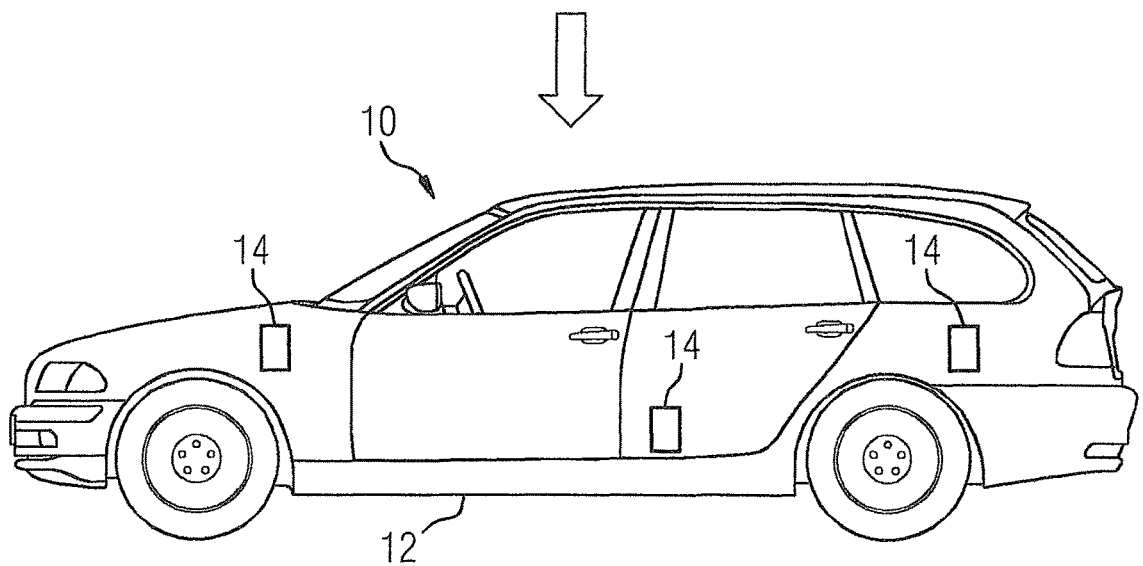
FIG. 1 is a simplified overview of a prior-art load identification technique.

FIG. 1 shows in simplified form the prior art method for identifying loads impacting the body structure 12 of a vehicle 10. To this end, FIG. 1 shows a vehicle 10, comprising a vehicle body structure 12, where a plurality of strain-gauge sensors 14 (only three are shown) is assigned to the body structure 12. It is to be understood that the sensors 14, while being shown as being applied on the outside of the body structure 12, can in practice be applied to the outside of the body structure 12 or to internal parts of the body structure 12. The totality of the sensors 14, each being applied at its relevant location, is referred to as the load identification instrumentation, or briefly the instrumentation, in the following.

The matrix-equation shown at the topmost part of FIG. 1 comprises a force vector 30, a calibration matrix 32 and a strain-data vector (strain vector) 34. The force vector 30 is unknown. The components of the force vector 30 pertain to various forces acting on the vehicle 10 and its body structure 12. Determining the force vector 30 and its components is the goal when performing a load identification to enable, for example, a vehicle dynamic performance evaluation.

The calibration matrix 32 and its parameters are also unknown, and cannot be measured. The strain vector 34 comprises the strain response data from the strain-gauge sensors 14 acquired through measurement in vehicle operational conditions. Once the calibration matrix 32 is known, the force vector 30 can be calculated based on the calibration matrix 32 and the strain vector 34.

However, the calibration matrix 32 comprises force over strain data, symbolically shown in FIG. 1 as $E_{[Y, Z]}/\varepsilon_{[1,2,3,4]}$ that cannot be measured. The calibration matrix 32 has thus as yet been determined indirectly by transfer function testing on the body structure 12 based on frequency response function (FRF) measurements. This yields strain over force relationships ($\varepsilon_{[1,2,3,4]}/F_{[Y, Z]}$). A resulting matrix comprising the strain over force data is to be inverted to allow calculation of the force vector 30, as shown in the lowermost part of FIG. 2. Inversion of the strain over force matrix is complex and may yield a calibration matrix 32 with limited load separation capabilities due to poor conditioning of the strain over force matrix, where the latter results from strongly coupled portions of the body structure 12 of the vehicle 10 and a resulting dependency of the strain over force data.

To overcome the poor conditioning of the strain over force matrix, prior art approaches have suggested to use an increased number of sensors 14, resulting in a large but intended overdetermination of strain measurements by, e.g., using at least three strain-gauge sensors 14 per load to be identified. However, this requires an increased amount of sensors 14 to be applied to the body structure 12 of the vehicle 10 and results in large and complex instrumentation setups (often two hundred and more sensors 14), which take a considerable amount of time to instrument and requires a system capable of processing the resulting data. The overdetermination yields an increased dimension of the strain vector 34 and consequently an increased dimension of the strain over force matrix, which in turn makes the inversion of this matrix ever more complex.

Once the strain over force matrix has successfully been inverted, the resulting calibration matrix 32 and data measured in vehicle operational conditions, i.e., the data comprised by the strain vector 34, can be used for identifying the loads acting on the vehicle 10 by determining the force vector 30. However, the calibration matrix 32 stemming from the frequency response function (FRF) measuring performed on the body structure 12 is body dependent and thus needs to be established again and again for every new body variant that is evaluated in a project.

The approach presented in the following provides a solution for overcoming these drawbacks.

Figure 2:
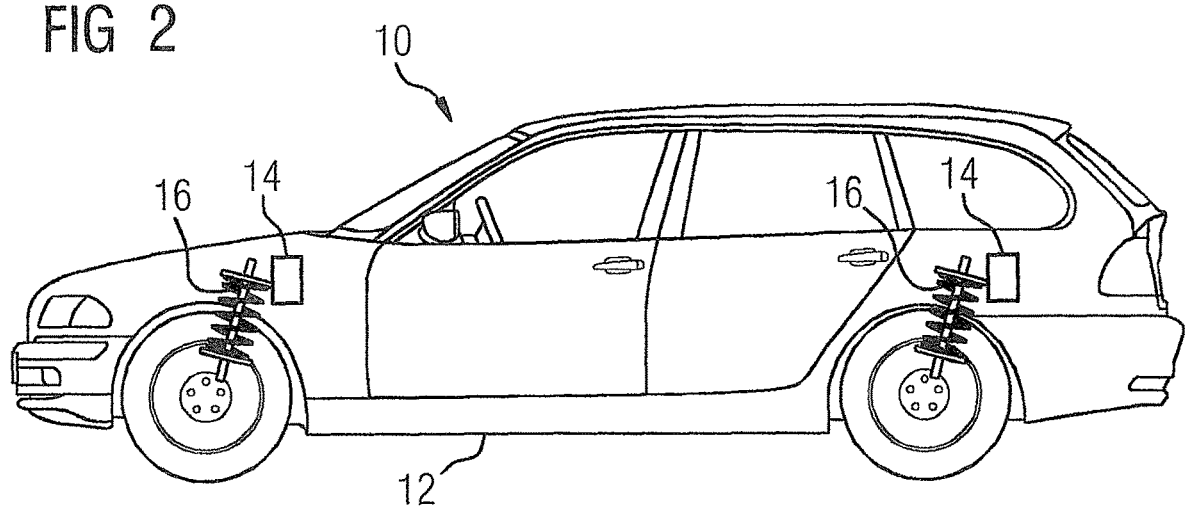
FIG. 2 shows a vehicle, comprising a vehicle body and suspension system, with sensors assigned to suspension system components in accordance with the invention.

A first aspect of the approach involves assigning the sensors 14 to a vehicle suspension system 16, as opposed to the sensors 14 being assigned to the vehicle body structure 12 as in the prior art (FIG. 1). To this end, FIG. 2 shows the vehicle 10 of FIG. 1, comprising a vehicle body structure 12 and a suspension system 16, the latter being exemplified by a front and a rear suspension spring. The sensors 14 (only two are shown) are assigned to the suspension system 16 and its individual suspension components, e.g. suspension springs, lateral suspension links, stabilizer bars, or dampers, as indicated in FIG. 1. In an exemplary embodiment, at least one sensor 14, e.g., a strain-gauge sensor 14, is applied to each major component of the suspension system 16.

Figure 3:
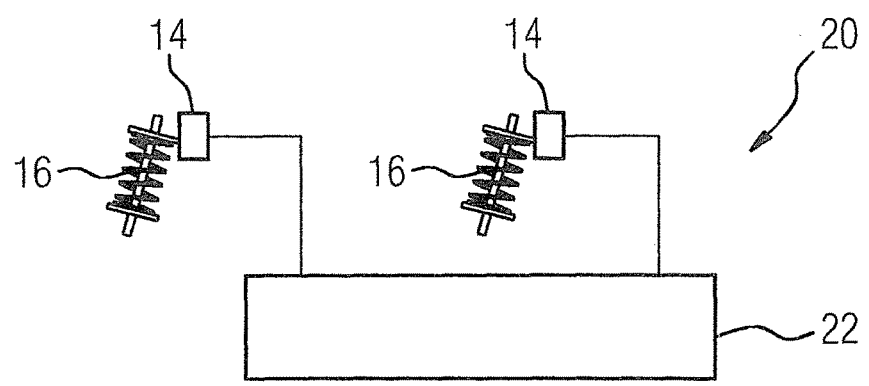
FIG. 3 shows a system enabling load identification comprising sensors assigned to components of the suspension system of a vehicle and a processing unit for receiving and processing data from sensors.

FIG. 3 shows a system 20, comprising the sensors 14 of FIG. 2 each being assigned to one suspension system component, and a processing unit 22 for processing strain-data obtained by the sensors 14. The sensors 14 are communicatively connected to the processing unit 22 in an appropriate manner, i.e., wire-bound or wireless. The processing unit 22 thus functions as a measuring system for receiving and processing the relevant strain-data.

The strain response from a component of the suspension system 16 is the result of a relatively limited set of forces compared to a strain response from the vehicle body structure 12. As a result, processing the strain-data obtained from sensors 14 assigned to the suspension system 16 is a far less complex problem to solve and less overdetermination, i.e., number of responses required to identify one force, is needed. For example, nine forces pertain to a lateral link of the suspension system 16, i.e., three forces acting on each end and three forces acting in the middle of the link from a strut that is supported on the link. In contrast, the strain on the vehicle body structure 12 results from forty to sixty forces. Consequently, a significantly reduced number of sensors 14 are required in the instrumentation, i.e., as part of the system 20, when the sensors 14 are assigned to the suspension system 16.

A second aspect of the approach presented here involves replacement of the prior art transfer-function calibration measurements by a number of measurements obtained in unique kinematics & compliance scenarios, e.g., vehicle bounce, vehicle roll, lateral parallel or opposed inputs at the tire patches, aligning torque parallel or opposed inputs at the tire patches, or longitudinal inputs at the tire patches, in both a test environment and a simulation environment.

In a test environment, the suspension strain responses are measured during execution of a number of the kinematics & compliances scenarios, termed K&C scenarios for the sake of brevity in the following.

In a simulation environment, the suspension to body loads are identified for the same K&C scenarios applied in the test environment. The simulation environment uses a multi-body simulation model known per se in the art.

A simulation in the simulation environment employing a K&C scenario is termed K&C simulation in the following and a test in the test environment employing a K&C scenario is termed K&C test, accordingly. The strain responses and the suspension to body loads are denominated as E and F, respectively.

The K&C tests and K&C simulations provide strain-data E, on the one hand, and load-data F, on the other hand. Both are acquired under identical boundary conditions in the test environment and the simulation environment, respectively. Knowing the loads F in defined conditions (the K&C scenarios) and having the suspension responses (the strain data E), in those same identical conditions, enables identification of the link between the loads F of interest and the suspension strain responses E. The link can be written as $H=F*E^{-1}$, where H is the calibration matrix 32, F is the force vector 30 and E is the strain vector 34 of the matrix equation shown in FIG. 1 ($F=H*E \Leftrightarrow H=F*E^{-1}$) and the determination of the calibration matrix 32 based on the load-data F and the strain-data E is a matrix multiplication of a force matrix based on the load-data F with the inverse of the strain-data matrix based on the strain-data E.

As multiple K&C tests and K&C simulations are applied, where each K&C scenario excites unique phenomena in the suspension system 16, this approach results in a robust relation between the loads F of interest and the suspension strain response. The resulting calibration matrix 32 can be used to identify the time-domain loads when performing full vehicle operational tests on a test-track. Through this different load calibration approach, there is no need for body-side transfer-function measurements and because the identification process of the calibration matrix 32 is mathematically different from the approach in the prior art, the calibration matrix 32 no longer needs to be inverted, resulting in a far more robust and accurate load identification.

Figure 4:
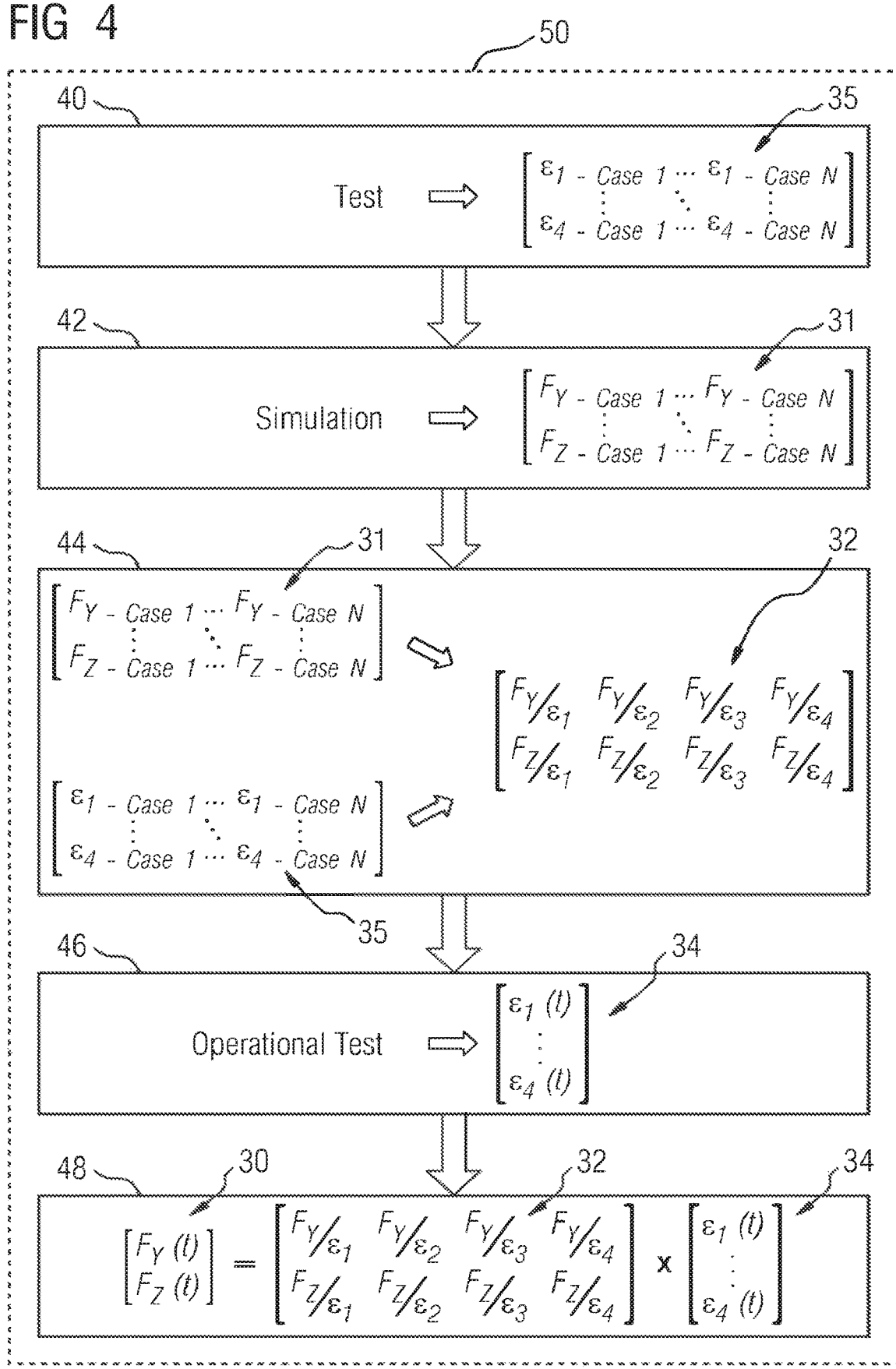
FIG. 4 is a simplified diagram of a method for efficient load identification for vehicle operational conditions in accordance with the invention.

The system 20 (FIG. 2) performs the following steps 40-48, shown in FIG. 4, for identifying the loads acting on a vehicle 10. In a first step 40, the system 20 acquires strain-data E from the sensors 14 applied to the suspension system 16 and generates a strain-data vector (single K&C scenario) or a strain-data matrix 35 (multiple K&C scenarios). This data is obtained by applying at least one K&C test on the relevant vehicle 10.

In a second step 42, the system 20 calculates suspension-to-body forces F by applying the same K&C scenarios as applied in the first step 40 in a simulation environment and generates a force vector (single K&C scenario) or a force matrix 31 (multiple K&C scenarios).

On account of a vector constituting a special matrix, i.e., a n×l-matrix, a strain-data vector or a strain-data matrix 35 as well as a force vector or a force matrix 31 are jointly termed strain-data matrix 35 and force matrix 31 respectively, or briefly matrix 35, 31.

In a third step 44, the system 20 generates the calibration matrix 32 based on the matrices 35, 31 generated in the first and second steps 40, 42. The calibration matrix 32 results from a combination (matrix multiplication) of the matrix 35 and the matrix 31 or alternatively from any other applicable option for reconstructing the calibration data from a number of known forces, e.g., forces as comprised in the force matrix 31, and a number of known responses, e.g., responses as comprised in the strain-data matrix 35.

With the first, second and third steps 40, 42, 44 being performed via the system 20, the mathematical tools for identifying time-domain body loads acting on the body structure 12 of a vehicle 10 have been prepared.

In a fourth step 46 and subsequent steps, these tools are now applied. In the fourth step 46, track measurements (as opposed to the K&C test applied in the first step 40) are performed to acquire operational strain-data from the sensors 14 applied to the suspension system 16 and a strain-data vector 34 comprising operational strain-data is composed with this data.

In a fifth step 48, using the calibration matrix 32 generated in the third step 44 and the operational strain-data in the operational strain-data vector 34 generated in the fourth step 46, the time-domain body loads, i.e., the elements of the force vector 30, resulting from a matrix multiplication of the calibration matrix 32 and the operational strain-data vector 34, are determined.

The fourth step 46 and the fifth step 48 can be repeated as often as necessary and desired for identifying loads, i.e., forces, acting on the vehicle body 12 in accordance with this inventive approach presented here.

The steps 40-48 shown in FIG. 4 can be perceived as a simplified representation of a computer program 50 providing an implementation of the method for efficient load identification proposed in this disclosure. Such a computer program 50 will be stored in a memory (not shown) of the processing unit 22 of the system 20 shown in FIG. 2 or a similar device for efficient load identification and will be executed via a processor (not shown) of the processing unit 22 for efficient load identification in accordance with the disclosed embodiments of the invention.

By employing the disclosed method in accordance with the embodiments of the invention, more particularly by employing a computer program 50 providing the method, load identification can be performed faster and at lower costs. The proposed method requires less instrumentation efforts on account of the fewer required sensors 14. The load calibration matrix 32 is not dependent on the body structure 12 of the relevant vehicle 10.

Generally, the load calibration matrix 32 is generated via K&C tests and simulations, where at least one dedicated K&C scenario, usually a number of dedicated K&C scenarios, e.g., scenarios known as "vertical parallel", "vertical opposed", "lateral parallel", "lateral opposed", "aligning torque parallel", "aligning torque opposed", or "longitudinal". in professional terminology, are applied. This replaces the fully test-based prior art approach of measuring the transfer-functions between strain-responses and body forces. As the calibration matrix 32 resulting from the K&C tests and simulations no longer needs to be inverted, the subsequent load identification procedure (fifth step 48) does not suffer from the potential conditioning problems of the prior art load identification approach.

It is to be understood that the embodiment used for describing the disclosed approach is but one example and not to be construed as limiting. Therefore, while vehicle dynamics performance analysis has been used as the basis for the present disclosure, the proposed load identification method can be used for a wide variety of applications, such as vehicle primary ride evaluation, in-depth suspension performance evaluation, or acquisition of objective data that can be linked to subjective perceptions of drivers. Furthermore, while the present disclosure has been based on K&C scenarios for ascertaining a dedicated unique boundary condition for the relevant system, e.g., a vehicle 10, it is to be understood that providing such unique boundary conditions (dedicated conditions) is the key aspect and that these may be provided by other means, such as an application of known loads to the physical vehicle or to a vehicle component, e.g., the engine block, while acquiring system responses (e.g., strain responses) that can be made proportional to the loads of interest. In a simulation environment, similar load applications can be applied to the system, where the system interface loads of interest are calculated, such as the engine to body loads. Therefore, the disclosed approach can be generalized as being a method, system, apparatus etc. for identifying loads impacting a vehicle 10, where the vehicle 10 comprises a vehicle body 12 and a suspension system 16, and where the method comprises and the system or apparatus executes or is configured to execute the steps of (i) acquiring a system response (e.g., strain-data 35) from a plurality of sensors 14 assigned to the vehicle's 10 suspension system 16 under dedicated conditions in a test environment (e.g., under conditions resulting from applying K&C scenarios in a test environment), (ii) acquiring system loads (e.g., suspension system to vehicle body loads data 31)

by applying the same dedicated conditions in a simulation environment (e.g., by applying conditions resulting from applying the same K&C scenarios as used when acquiring the system response in a test environment), (iii) generating a calibration matrix 32 based on data pertaining to the system response (e.g., the strain-data 35) and on data pertaining to the said system loads (e.g. the suspension system to vehicle body forces-data 31), (iv) acquiring an operational system response (e.g., operational strain-data 34) from the sensors 14 in a test-track situation, and (v) using the operational system response (e.g., strain-data 34) and the calibration matrix 32 to calculate numerical values for the loads impacting the vehicle 10.

The present invention provides a multitude of advantages to the supplier and system integrator. First and foremost is the more robust and accurate load identification, which is due to the previously required matrix inversion having been rendered unnecessary by the approach disclosed, here. Secondly, significantly less sensors 14 are required to enable the load identification, saving both instrumentation and data analysis time. The developed approach only requires instrumentation for the forces of interest, because there is no cross-influence between forces in the calibration matrix 32. The calibration matrix 32 is identified for each force (each row) individually and the presence of one force in the calibration matrix 32 does not influence the calibration value of another force. Third, the time consuming transfer function measurements for load calibration are replaced by short duration K&C tests and simulations giving another timing advantage. Overall, the total throughput time from instrumentation time to identified loads is significantly reduced compared to the classic load identification approach. Also, with the sensors 14 being applied to the vehicle's suspension system 16 and not to the vehicle body 12, the calibration matrix 32 does not need to be re-measured for different vehicle body types, and once generated, the calibration matrix 32 can be re-used for the subsequent calculation of numerical values for the loads impacting a vehicle 10.

In addition to the embodiments of the aspects of the present invention described above, those of skill in the art will be able to arrive at a variety of other arrangements and steps which, if not explicitly described in this document, nevertheless embody the principles of the invention and fall within the scope of the appended claims.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for identifying loads impacting a vehicle, said vehicle comprising a vehicle body and a suspension system, said method comprising the steps of:

acquiring a system response from a plurality of sensors under dedicated conditions in a test environment, the plurality of sensors being assigned to the suspension system of the vehicle;

acquiring system loads via application of the same dedicated conditions in a simulation environment;

generating a calibration matrix based on data pertaining to the acquired system response and data pertaining to the acquired system loads;

acquiring an operational system response from the plurality of sensors in a test-track situation; and utilizing the acquired operational system response and the generated calibration matrix to calculate numerical values for loads impacting the vehicle.

2. The method according to claim 1, wherein the acquired system response is strain-data obtained from the plurality of sensors;

wherein the acquired system loads is suspension system to vehicle body loads data;

wherein the dedicated conditions in the test environment are conditions resulting from applying dedicated K&C scenarios in the test environment;

wherein the dedicated conditions in the simulation environment are conditions resulting from applying the same kinematics & compliances (K&C) scenarios as utilized when acquiring the strain-data in the test environment;

wherein the data pertaining to the system response is the strain-data;

wherein the data pertaining to the system loads is the suspension system to vehicle body forces-data; and wherein the acquired operational system response is operational strain-data obtained from the plurality of sensors.

3. The method according to claim 1, wherein a first matrix is generated based on the acquired system loads;

wherein a second matrix is generated based on the acquired system response;

wherein the calibration matrix is generated by a multiplication of the first matrix with an inverse of the second matrix;

wherein the operational system response is combined to an operational system response vector; and wherein the numerical values for the loads impacting the vehicle are calculated via a matrix multiplication of the generated calibration matrix and the operational system response vector.

4. The method according to claim 2, wherein a first matrix is generated based on the acquired system loads;

wherein a second matrix is generated based on the acquired system response;

wherein the calibration matrix is generated by a multiplication of the first matrix with an inverse of the second matrix;

wherein the operational system response is combined to an operational system response vector; and wherein the numerical values for the loads impacting the vehicle are calculated via a matrix multiplication of the generated calibration matrix and the operational system response vector.

5. The method according to claim 2, wherein the strain-data is combined to a strain-data matrix;

wherein the suspension system to vehicle body forces-data is combined to a force matrix;

wherein the calibration matrix is generated by a multiplication of the force matrix with an inverse of the strain-data matrix;

wherein the operational strain-data is combined to an operational strain-data vector; and wherein the numerical values for the loads impacting the vehicle are calculated via a matrix multiplication of the calibration matrix and the operational strain-data vector.

6. A system for identifying loads impacting a vehicle having a vehicle body and a suspension system, the system comprising:
  a processing unit; and
  a plurality of sensors assigned to the suspension system of the vehicle for obtaining strain-data;
  wherein the system is configured to:
    acquire a system response from a plurality of sensors under dedicated conditions in a test environment;
    acquire system loads via application of the same dedicated conditions in a simulation environment;
    generate a calibration matrix based on data pertaining to the acquired system response and data pertaining to the acquired system loads;
    acquire an operational system response from the plurality of sensors in a test-track situation; and
    utilize the acquired operational system response and the generated calibration matrix to calculate numerical values for the loads impacting the vehicle.

7. The system according to claim 6, further comprising: sensors communicatively connected to the processing unit.

8. The system according to claim 6, wherein the acquired system response comprises strain-data obtained from the plurality of sensors;
  wherein the acquired system loads comprises suspension system to vehicle body loads data;
  wherein the dedicated conditions in the test environment comprise conditions resulting from applying dedicated kinematics & compliances (K&C) scenarios in the test environment;
  wherein the dedicated conditions in the simulation environment comprise conditions resulting from applying the same dedicated K&C scenarios as used when acquiring the strain-data in the test environment;
  wherein the data pertaining to the system response comprises the strain-data;
  wherein the data pertaining to the system loads further comprises the suspension system to vehicle body forces-data; and
  wherein the acquired operational system response comprises operational strain-data obtained from the plurality of sensors.

9. A processing unit for identifying loads impacting a vehicle having a suspension system;
  wherein the processing unit is configured to:
    acquire a system response from a plurality of sensors under dedicated conditions in a test environment;
    acquire system loads via application of the same dedicated conditions in a simulation environment;
    generate a calibration matrix based on data pertaining to the acquired system response and data pertaining to the acquired system loads;
    acquire an operational system response from the plurality of sensors in a test-track situation; and
    utilize the acquired operational system response and the generated calibration matrix to calculate numerical values for the loads impacting the vehicle.

10. A non-transitory computer program product including program instructions which, when executed by a processing unit, cause the processing unit to implement a method for identifying loads impacting a vehicle including a suspension system, the instructions comprising:
  program code for acquiring a system response from a plurality of sensors under dedicated conditions in a test environment, the plurality of sensors being assigned to the suspension system of the vehicle;
  program code for acquiring system loads via application of the same dedicated conditions in a simulation environment;
  program code for generating a calibration matrix based on data pertaining to the acquired system response and the generated data pertaining to the said system loads;
  program code for acquiring an operational system response from the plurality of sensors in a test-track situation; and
  program code for utilizing the acquired operational system response and the generated calibration matrix to calculate numerical values for the loads impacting the vehicle.

* * * * *